(12) United States Patent
Umeyama et al.

(10) Patent No.: US 11,673,380 B2
(45) Date of Patent: Jun. 13, 2023

(54) MULTILAYER TUBE

(71) Applicant: SEKISUI CHEMICAL CO., LTD., Osaka (JP)

(72) Inventors: Shintarou Umeyama, Kyoto (JP); Kouzou Makino, Kyoto (JP); Yoshihiro Inui, Kyoto (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 17/764,286

(22) PCT Filed: Sep. 30, 2020

(86) PCT No.: PCT/JP2020/037291
§ 371 (c)(1),
(2) Date: Mar. 28, 2022

(87) PCT Pub. No.: WO2021/066066
PCT Pub. Date: Apr. 8, 2021

(65) Prior Publication Data
US 2022/0347989 A1    Nov. 3, 2022

(30) Foreign Application Priority Data

Sep. 30, 2019 (JP) .............................. JP2019-179798

(51) Int. Cl.
*B32B 27/32* (2006.01)
*B32B 1/08* (2006.01)
*B32B 27/08* (2006.01)

(52) U.S. Cl.
CPC ................ *B32B 27/32* (2013.01); *B32B 1/08* (2013.01); *B32B 27/08* (2013.01);
(Continued)

(58) Field of Classification Search
CPC ........... B32B 27/32; B32B 1/08; B32B 27/08; B32B 2307/7242; B32B 2307/732; B32B 2597/00
See application file for complete search history.

(56) References Cited

U.S. PATENT DOCUMENTS

2009/0082513 A1   3/2009  Kourogi et al.
2021/0324977 A1   10/2021 Kondou et al.

FOREIGN PATENT DOCUMENTS

JP           6-221471       8/1994
JP        2004-223910       8/2004
(Continued)

OTHER PUBLICATIONS

International Search Report (ISR) dated Dec. 8, 2020 in International (PCT) Application No. PCT/JP2020/037291.

*Primary Examiner* — Michael C Miggins
(74) *Attorney, Agent, or Firm* — Wenderoth, Lind & Ponack, L.L.P.

(57) ABSTRACT

A multilayer tube is provided which suppresses the amount of calcium and organic component leaching to a low level and which can be realized as a tube that has mechanical properties at 60° C. This multilayer tube includes a first polyolefin resin layer configuring the innermost layer, and a second polyolefin resin layer arranged outside of the first polyolefin resin layer; the amount of calcium leaching, measured in accordance with SEMI F-57, of the material of the first polyolefin resin layer is less than 30 μg/m2; the ratio of the thickness of the first polyolefin resin layer to the total thickness of the first polyolefin resin layer and the second polyolefin resin layer is 0.011-0.17. By means of this configuration, it is possible to suppress the amount of leaching of calcium and organic substances to a low level, and to realize a pipe having a strength that takes into account a 60° C. use environment.

9 Claims, 2 Drawing Sheets

(52) U.S. Cl.
CPC . *B32B 2307/7242* (2013.01); *B32B 2307/732* (2013.01); *B32B 2597/00* (2013.01)

(56) References Cited

FOREIGN PATENT DOCUMENTS

| | | |
|---|---|---|
| JP | 2004-299808 | 10/2004 |
| JP | 2005-111895 | 4/2005 |
| JP | 2005-224656 | 8/2005 |
| JP | 2006-130909 | 5/2006 |
| JP | 2010-234576 | 10/2010 |
| JP | 2012-224870 | 11/2012 |
| WO | 2020/080470 | 4/2020 |

MULTILAYER TUBE

TECHNICAL FIELD

The present invention relates to a multilayer tube. More specifically, the present invention relates to a multilayer tube made of a polyolefin-based resin useful as a pipe for a semiconductor cleaning solution.

BACKGROUND ART

Conventionally, in the manufacture of a precision device related to a semiconductor, a semiconductor cleaning solution obtained by appropriately mixing ultrapure water purified to an extremely high purity and an ultra-high purity cleaning solution in which necessary components are purified to an extremely high purity is used in a wet process such as cleaning. When metal ions and/or organic substances are present at a predetermined concentration or more in the semiconductor cleaning solution, the metals and/or the organic substances are adsorbed on the surface of a wafer or the like, which adversely affects the quality of the precision device. Therefore, impurities in the semiconductor cleaning solution are thoroughly restricted.

The mixing of the impurities into the semiconductor cleaning solution also occurs in a pipe which configures a semiconductor cleaning solution transportation line. As the material of the pipe, a metal such as stainless steel having excellent gas barrier properties has been used in some cases, but a resin is said to be preferably used in consideration of the influence of the elution of the metal from the pipe.

As the resin used as the material of the pipe for the semiconductor cleaning solution, a fluororesin, which is chemically inert, has gas barrier properties, and has extremely low elutability into the semiconductor cleaning solution is used. For example, Patent Document 1 discloses a fluororesin double tube including two laminated fluororesin layers as a pipe used in a semiconductor manufacturing apparatus. The tube includes an inner layer tube and an outer layer tube. The inner layer tube is made of a fluororesin having excellent corrosion resistance and chemical resistance (for example, a tetrafluoroethylene-perfluoroalkyl vinyl ether copolymer (PFA), a tetrafluoroethylene-hexafluoropropylene copolymer (FEP), or a tetrafluoroethylene-ethylene copolymer (ETFE)). The outer layer tube is made of a fluororesin capable of suppressing gas permeation (for example, polyvinylidene fluoride (PVDF)). Patent Document 2 discloses a multilayer pipe for a pipe of ultrapure water. The multilayer pipe includes a first resin layer made of a fluororesin and being in contact with ultrapure water, and a second resin layer made of a gas impermeable resin and provided on the outer peripheral surface of the first resin layer. Furthermore, Patent Document 2 discloses that a third resin layer for protecting the second resin layer is provided on the outer peripheral surface of the second resin layer, and polyethylene is used as the third resin layer.

Among resins used as materials of the pipe for the semiconductor cleaning solution, polyvinylidene fluoride (PVDF) is used in all of pipes put to practical use in a semiconductor cleaning solution manufacturing apparatus and for transportation of the semiconductor cleaning solution from the semiconductor cleaning solution manufacturing apparatus to use points in the semiconductor field, and becomes a technical standard in the pipe for the semiconductor cleaning solution.

Recently, as the degree of integration of semiconductor chips increases, circuit patterns become finer and finer, and are more susceptible to low-level impurities. Therefore, quality required for the semiconductor cleaning solution becomes stricter. For example, standards for the quality and the like of the semiconductor cleaning solution used in semiconductor manufacture are published as SEMI F75, and updated every two years.

PRIOR ART DOCUMENTS

Patent Documents

Patent Document 1: Japanese Patent Laid-open Publication No. 2004-299808

Patent Document 2: Japanese Patent Laid-open Publication No. 2010-234576

SUMMARY OF THE INVENTION

Problems to be Solved by the Invention

In the background of stricter quality required for the semiconductor cleaning solution, the pipe made of a fluororesin such as PVDF is the only option as the pipe which satisfies the required water quality, and its outstanding performance is strongly supported. However, due to the particularity of the application, the pipe is disadvantageous in terms of workability and cost as compared with other general pipe. In addition, the ultra-high purity cleaning solution often contains a diaminoalkane such as 3-diaminopropane and is used under the condition of 60° C., which also disadvantageously causes accelerated deterioration.

Therefore, the present inventors dared to focus attention on the substitution of the material of the pipe for the semiconductor cleaning solution. Specifically, in view of the fact that a polyolefin-based resin having excellent workability and cost performance is used as a general piping material, an attempt has been made to substitute the polyolefin-based resin for the material of the pipe for the semiconductor cleaning solution.

However, the polyolefin-based resin which is widely used as the piping material is synthesized by polymerization using a chlorine-based catalyst, which makes it necessary to mix a neutralizing agent such as calcium stearate or hydrocalcite in order to neutralize a catalyst residue after the polymerization. For this reason, the polyolefin-based resin tube causes the elution of calcium and organic substances derived from a neutralizing agent into water to be transported. The elution levels of the calcium and organic substances are far inferior to the quality required for the semiconductor cleaning solution.

The present inventors have attempted to drastically reduce the amount of elution of the calcium and organic substances to an extent that can be achieved only by the pipe made of a fluororesin such as PVDF by using, as a material of a polyolefin-based resin pipe, a material in which the addition amount of a neutralizing agent to a catalyst in the polyolefin-based resin is extremely smaller than an original amount for the purpose of neutralizing a catalyst residue. However, meanwhile, in the polyolefin-based resin, the catalyst residue maintains the activity, which accelerates oxidative deterioration. As a result, the present inventors also faced a new problem causing unsatisfactory mechanical strength to be provided as the pipe (specifically, long-term durability against internal pressure). The degradation becomes particularly remarkable in the use environment of the semiconductor cleaning solution of 60° C.

That is, the substitution of the material of the pipe for the semiconductor cleaning solution with the polyolefin-based resin has been found to have peculiar problems that both the suppression of the amount of elution of the calcium and organic substances and the production of a pipe having mechanical characteristics in consideration of the use environment of 60° C. cannot be achieved.

In view of the above problems, it is an object of the present invention to provide a pipe made of a polyolefin-based resin, which can suppress the amount of elution of calcium and organic substances into a transport liquid to a low level, and can be produced so as to have mechanical characteristics in consideration of the use environment of 60° C. (specifically, refer to long-term durability against internal pressure, and hereinafter may be simply described as "strength").

Means for Solving the Problem

As a result of diligent studies, the present inventors have found that a polyolefin-based resin tube has a multilayer structure; a polyolefin-based resin layer containing a polyolefin-based resin material in which the amount of elution of calcium and organic substances is suppressed to a predetermined amount is disposed as an inner layer; and the thickness of the polyolefin-based resin layer as the inner layer is designed to be within a predetermined range, which can produce a pipe having mechanical characteristics in consideration of the use environment of 60° C. while suppressing the amount of elution of the calcium and organic substances to an extremely low level. The present invention has been completed by further studying based on this finding. That is, the present invention provides the inventions of the following aspects.

Item 1. A multilayer tube includes: a first polyolefin-based resin layer configuring an innermost layer; and a second polyolefin-based resin layer disposed outside the first polyolefin-based resin layer. An amount of elution of calcium, measured in accordance with SEMI F-57, of a material of the first polyolefin-based resin layer is less than 30 µg/m$^2$. A ratio of a thickness of the first polyolefin-based resin layer to a total thickness of the first polyolefin-based resin layer and the second polyolefin-based resin layer is 0.011 to 0.17.

Item 2. The multilayer tube according to item 1, wherein the multilayer tube is used for transportation of a semiconductor cleaning solution.

Item 3. The multilayer tube according to item 1 or 2, wherein the first polyolefin-based resin layer has a thickness of 0.07 mm or more.

Item 4. The multilayer tube according to any one of items 1 to 3, wherein the first polyolefin-based resin layer has a thickness of 0.94 mm or less, 0.07 or less.

Item 5. The multilayer tube according to any one of items 1 to 4, wherein an amount of elution of calcium, measured in accordance with SEMI F-57, of a material of the second polyolefin-based resin layer is 30 µg/m$^2$ or more.

Item 6. The multilayer tube according to any one of items 1 to 5, wherein a proportion of a component having a molecular weight of 1000 or less in an integral molecular weight distribution curve measured by gel permeation chromatography, of a polyolefin-based resin in the first polyolefin-based resin layer is 0.15% or more.

Item 7. The multilayer tube according to any one of items 1 to 6 further includes a gas barrier layer disposed outside the second polyolefin-based resin layer.

Item 8. The multilayer tube according to any one of items 2 to 7, wherein the semiconductor cleaning solution is used in a wet treatment step for a semiconductor element having a minimum line width of 65 nm or less.

Item 9. A method for manufacturing a multilayer tube includes the steps of: forming the multilayer tube by co-extruding a polyolefin-based resin composition for an innermost layer and a polyolefin-based resin composition for an outer layer; and cleaning at least an inner surface of the formed multilayer tube. The polyolefin-based resin composition for the innermost layer and the polyolefin-based resin composition for the outer layer are laminated so that the polyolefin-based resin composition for the innermost layer is disposed as the innermost layer, and the polyolefin-based resin composition for the outer layer is disposed outside the innermost layer. An amount of elution of calcium, measured in accordance with SEMI F-57, of the polyolefin-based resin composition for the innermost layer is less than 30 µg/m$^2$. A ratio of a thickness of the innermost layer to a total thickness of the innermost layer and the outer layer is 0.011 to 0.17.

Advantages of the Invention

According to the multilayer tube made of the polyolefin-based resin of the present invention, the amount of elution of calcium and organic substances into the transport liquid can be suppressed to a low level, and the multilayer tube can be produced as a pipe having strength in consideration of the use environment of 60° C.

EMBODIMENTS OF THE INVENTION

[1. Layer Configuration]

Figure 1:
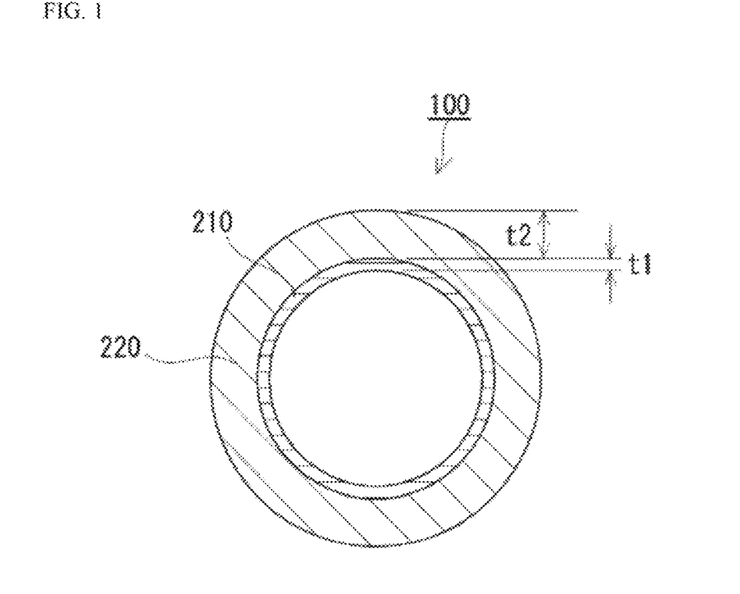
FIG. 1 is a schematic cross-sectional view showing an example of a multilayer tube of the present invention.
Figure 2:
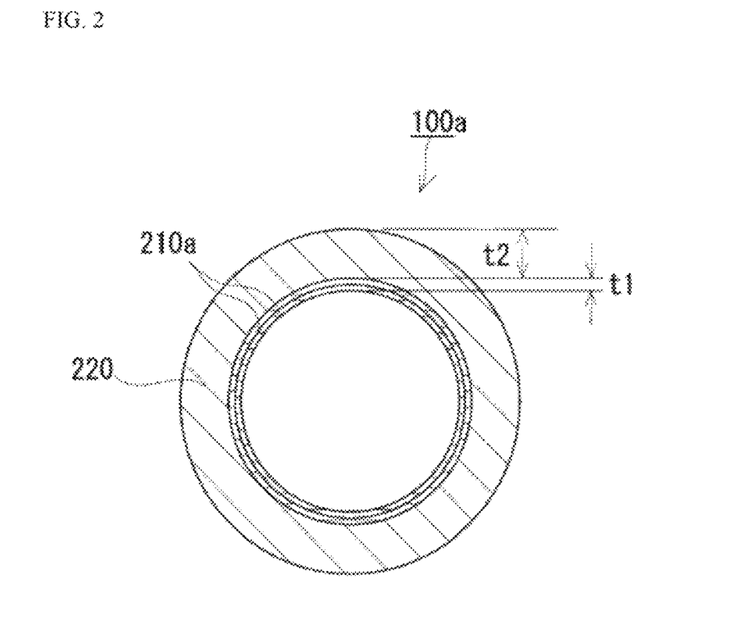
FIG. 2 is a schematic cross-sectional view showing another example of the multilayer tube of the present invention.
Figure 3:
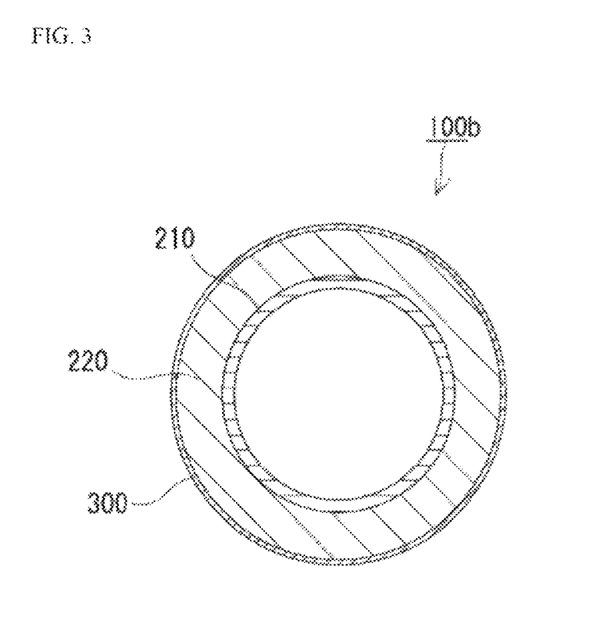
FIG. 3 is a schematic cross-sectional view showing still another example of the multilayer tube of the present invention.

A multilayer tube of the present invention includes a first polyolefin-based resin layer configuring an innermost layer and a second polyolefin-based resin layer disposed outside the first polyolefin-based resin layer. FIGS. 1 to 3 illustrate examples of the multilayer tube of the present invention.

A multilayer tube 100 shown in FIG. 1 includes a first polyolefin-based resin layer 210 and a second polyolefin-based resin layer 220. The first polyolefin-based resin layer 210 configures the innermost layer of the multilayer tube 100, and the second polyolefin-based resin layer 220 is laminated in contact with the first polyolefin-based resin layer 210. A multilayer tube 100a shown in FIG. 2 includes a first polyolefin-based resin layer 210a and a second polyolefin-based resin layer 220. The first polyolefin-based resin layer 210a has a multilayer structure. Although not shown, the multilayer tube of the present invention may include a first polyolefin-based resin layer having a single layer structure and a second polyolefin-based resin layer having a multilayer structure; may include a first polyolefin-based resin layer having a multilayer structure and a second polyolefin-based resin layer having a multilayer structure; or may include other layer between the first polyolefin-based resin layer 210 and the second polyolefin-based resin layer 220. A multilayer tube 100b shown in FIG. 3 includes a first polyolefin-based resin layer 210, a second polyolefin-based resin layer 220, and a gas barrier layer 300. The gas barrier layer 300 may be laminated outside the second polyolefin-based resin layer 220. The gas barrier layer 300 may configure the outermost layer of the multilayer tube 100b, or other layer may be provided outside the gas barrier layer 300.

[2. First Polyolefin-Based Resin Layer]

A polyolefin-based resin contained in the first polyolefin-based resin layer is not particularly limited, and may be a polymer containing monomer units derived from an olefin. Examples thereof include polyethylene-based resins, ethylene-carboxylic acid alkenyl ester copolymer resins, ethylene-α-olefin copolymer resins, polypropylene-based resins, polybutene-based resins, and poly(4-methyl-1-pentene)-based resins. These polyolefin-based resins may be used alone or in combination of two or more thereof. Among these polyolefin-based resins, polyethylene-based resins and polypropylene-based resins are preferable from the viewpoint of increasing the strength and the like of the multilayer tube. Among the polyethylene-based resins and the polypropylene-based resins, the polyethylene-based resins are more preferable from the viewpoint of suppressing the content of low molecular weight components to suppress the elution of organic components into transport liquid.

The polyethylene-based resins are not particularly limited, and examples thereof include low density polyethylene (LDPE), linear low density polyethylene (LLDPE), medium density polyethylene (MDPE), and high density polyethylene (HDPE). Among these, the high density polyethylene (HDPE) is preferable from the viewpoint of suppressing the elution of the organic components into the transport liquid.

Examples of carboxylic acid alkenyl esters in the ethylene-carboxylic acid alkenyl ester copolymer resins include vinyl acetate, vinyl propionate, vinyl butyrate, isopropenyl acetate, and allyl acetate, and vinyl acetate is preferable.

Examples of the ethylene-α-olefin copolymer include a copolymer obtained by copolymerizing an α-olefin such as propylene, 1-butene, 1-pentene, 1-hexene, 4-methyl-1-pentene, or 1-octene as a copolymerization component with ethylene in a ratio of about several mol %.

Examples of the polypropylene-based resins include homopolypropylene, block polypropylene, and random polypropylene. Typical examples of a copolymerization component in the block polypropylene and the random polypropylene include ethylene. Examples of the polybutene-based resins include polybutene-1.

A proportion of a component having a molecular weight of 1000 or less in an integral molecular weight distribution curve measured by gel permeation chromatography (in terms of polystyrene), of a polyolefin-based resin contained in the first polyolefin-based resin layer is, for example, 0.15% or more. Furthermore, the proportion of the component having a molecular weight of 1000 or less in the integrated molecular weight distribution curve is preferably 0.45% or more, more preferably 0.65% or more, and still more preferably 0.7% or more, from the viewpoint of favorably obtaining processability during tube formation. The upper limit of the proportion of the component having a molecular weight of 1000 or less in the integral molecular weight distribution curve is not particularly limited, and is, for example, 0.9% or less, and preferably 0.8% or less.

The molecular weight of the polyolefin-based resin contained in the first polyolefin-based resin layer is not particularly limited, and the weight average molecular weight Mw is, for example, $1\times10^5$ to $10\times10^5$. From the viewpoint of suppressing the elution of the organic components into the transport liquid and obtaining surface smoothness, the weight average molecular weight Mw is, for example, preferably $3\times10^5$ to $10\times10^5$, and more preferably $4\times10^5$ to $9\times10^5$. The weight average molecular weight Mw is a value measured in terms of polystyrene by gel permeation chromatograph measurement.

The molecular weight distribution (Mw/Mn) of the polyolefin-based resin contained in the first polyolefin-based resin layer is 2 or more, for example, 2 to 30, from the viewpoint of processability during tube formation. Furthermore, from the viewpoint of also suppressing the elution of the organic components into the transport liquid, the molecular weight distribution (Mw/Mn) is preferably 2 to 28. From the viewpoint of more favorably obtaining these effects, the molecular weight distribution (Mw/Mn) of the polyolefin-based resin contained in the first polyolefin-based resin layer is preferably 6 to 26, more preferably 10 to 24, and still more preferably 18 to 23. The molecular weight distribution (Mw/Mn) is a value (Mw/Mn) obtained by determining a weight average molecular weight (Mw) and a number average molecular weight (Mn) in terms of polystyrene by gel permeation chromatograph measurement, and dividing Mw by Mn.

An amount of elution of calcium, measured in accordance with EMI F-57, of a material (polyolefin-based resin composition) of the first polyolefin-based resin layer is less than 30 µg/m². When the material having the amount of elution of calcium of 30 µg/m² or more is used, the amount of elution of calcium into the semiconductor cleaning solution becomes excessive at the time of using the multilayer tube, and the required quality of the semiconductor cleaning solution cannot be satisfied particularly when the multilayer tube is used for transportation of the semiconductor cleaning solution. From the viewpoint of further suppressing the amount of elution of calcium into the transport liquid, the amount of elution of calcium of the material of the first polyolefin-based resin layer is preferably 29 µg/m² or less, and more preferably 28 µg/m² or less. The amount of elution of calcium of the material of the first polyolefin-based resin layer is preferably as small as possible, whereby the lower limit thereof is most preferably 0 µg/m². However, in a case where mixing of a trace amount of calcium is unavoidable, such as a case where a chlorine-based catalyst such as a Ziegler-Natta catalyst is used for synthesis of the polyolefin-based resin used for the first polyolefin-based resin layer and a slight amount of neutralizing agent is used, the amount of elution of calcium of the material of the first polyolefin-based resin layer is, for example, 1 µg/m² or more, 5 µg/m² or more, 10 µg/m² or more, 15 µg/m² or more, 20 µg/m² or more, or 25 µg/m² or more.

A calcium concentration in the material (polyolefin-based resin composition) of the first polyolefin-based resin layer is not particularly limited as long as the above-described amount of elution of calcium is satisfied, and is, for example, 10 ppm or less. From the viewpoint of further suppressing the amount of elution of calcium into the transport liquid, the calcium concentration in the material of the first polyolefin-based resin layer is preferably 8 pp or less, more preferably 7 ppm or less, and still more preferably 6 ppm or less. As the calcium concentration in the first polyolefin-based resin layer is lower, the amount of elution of calcium into the transport liquid is smaller. Therefore, from this viewpoint, the calcium concentration is most preferably 0 ppm. However, in a case where mixing of a trace amount of calcium is unavoidable, such as a case where a chlorine-based catalyst such as a Ziegler-Natta catalyst is used for synthesis of the polyolefin-based resin used for the first polyolefin-based resin layer and a slight amount of neutralizing agent is used, the calcium concentration in the first polyolefin-based resin layer is, for example, 0.3 ppm or more, or 0.5 ppm or more.

An amount of elution of organic components (total organic carbon; TOC), measured in accordance with EMI F-57, of a material (polyolefin-based resin composition) of the first polyolefin-based resin layer is, for example, 800 µg/m$^2$ or less. From the viewpoint of further suppressing the amount of elution of organic components into the transport liquid, the amount of elution of organic components of the material of the first polyolefin-based resin layer is preferably 600 µg/m$^2$ or less, more preferably 400 µg/m$^2$ or less, and still more preferably 360 µg/m$^2$ or less. The amount of elution of organic components of the material of the first polyolefin-based resin layer is preferably as small as possible, whereby the lower limit thereof is most preferably 0 µg/m$^2$. However, in a case where mixing of a trace amount of calcium is unavoidable, such as a case where a chlorine-based catalyst such as a Ziegler-Natta catalyst is used for synthesis of the polyolefin-based resin used for the first polyolefin-based resin layer and a slight amount of neutralizing agent is used, the amount of elution of organic components of the material of the first polyolefin-based resin layer is, for example, 5 µg/m$^2$ or more, 10µg/m$^2$ or more, 100 µg/m$^2$ or more, 200 µg/m$^2$ or more, or 300 µg/m$^2$ or more.

When the first polyolefin-based resin layer 210a is multi-layered as in, for example, the multilayer tube 100a, the amount of elution of calcium, the concentration of calcium, and/or the amount of elution of organic components of the material of the innermost layer of the multi-layered first polyolefin-based resin layer 210a can be designed to be lower than those of the material of the other layer of the first polyolefin-based resin layer 210a.

The multilayer tube is provided with a degassing device for removing oxygen, which eliminates the need for an antioxidant in the first polyolefin-based resin layer. The antioxidant is not contained in the first polyolefin-based resin layer, whereby the elution of the organic components into the transport liquid can be further suppressed. The antioxidant to be eliminated is not particularly limited as long as it is used for an ordinary polyolefin-based resin, and examples thereof include phenol-based antioxidants, phosphorus-based antioxidants, sulfur-based antioxidants, aromatic amine-based antioxidants, and lactone-based antioxidants.

From the viewpoint of further suppressing the amount of elution of calcium and/or organic components into the transport liquid, the thickness t1 of the first polyolefin-based resin layer is, for example, 0.07 mm or more, and preferably 0.2 mm or more. Although depending on the thickness of the second polyolefin-based resin layer, for example, when the thickness t2 of the second polyolefin-based resin layer is 4 mm or more, the thickness t1 of the first polyolefin-based resin layer is more preferably 0.4 mm or more, still more preferably 0.6 mm or more, yet still more preferably 0.8 mm or more, and particularly preferably 0.85 mm or more, from the viewpoint of further suppressing the amount of elution of calcium and organic components into the transport liquid. The upper limit of the range of the thickness t1 of the first polyolefin-based resin layer is, for example, 0.94 mm or less, and preferably 0.92 mm or less from the viewpoint of further increasing the strength of the multilayer tube in the use environment of 60° C. and the viewpoint of further suppressing the amount of elution of calcium and/or organic components into the transport liquid.

The ratio t1 [t1/(t1+t2)] of the thickness of the first polyolefin-based resin layer to the sum of the thickness t1 of the first polyolefin-based resin layer and the second polyolefin-based resin layer t2 is 0.11 to 0.17. When the lower limit of the ratio is less than 0.11, the migration of calcium and organic components contained in the second polyolefin-based resin layer into the transport liquid cannot be sufficiently stopped at the time of use, whereby the amount of elution of calcium and organic components into the semiconductor cleaning solution becomes excessive, and the required quality of the semiconductor cleaning solution cannot be satisfied. When the upper limit of the ratio is more than 0.17, the strength of the multilayer tube in the use environment of 60° C. cannot be secured.

From the viewpoint of further suppressing the amount of elution of calcium and organic components, the lower limit of the ratio is preferably 0.013 or more, more preferably 0.04 or more, still more preferably 0.08 or more, yet still more preferably 0.12 or more, particularly preferably 0.135 or more, and most preferably 0.15 or more. From the viewpoint of further increasing the strength of the multilayer tube in the use environment of 60° C., the upper limit of the ratio is preferably 0.165 or less, and more preferably 0.16 or less.

Furthermore, the thickness of the first polyolefin-based resin layer is more preferably adjusted within a range of SDR (reference outer diameter/minimum wall thickness) of 7 to 17. The SDR is preferably 7 or more in that the inner diameter of the tube is sufficient with respect to the outer diameter, which makes it easy to secure the transport amount of the transport liquid. The SDR is preferably 17 or less in that the thickness of the second polyolefin-based resin layer is secured to compensate for the insufficient strength of the first polyolefin-based resin layer itself, thereby providing more preferable strength suitable for practical use as the entire multilayer tube.

[3. Second Polyolefin-Based Resin Layer]

A polyolefin-based resin contained in the second polyolefin-based resin layer is not particularly limited, and can be appropriately selected from those exemplified as the polyolefin-based resin contained in the first polyolefin-based resin layer. Among the polyolefin-based resins described above, high density polyethylene (HDPE) is preferable from the viewpoint of suppressing the elution of low molecular weight components and/or the viewpoint of durability when the pipe is cleaned with a chemical. The polyolefin-based resin used for the second polyolefin-based resin layer may be the same type as or different from the polyolefin-based resin used for the first polyolefin-based resin layer, but when both the layers are laminated in contact with each other, the polyolefin-based resins are more preferably the same type from the viewpoint of improving the adhesion between both the layers to exhibit preferable strength.

The molecular weight of the polyolefin-based resin contained in the second polyolefin-based resin layer is not particularly limited, and is preferably more than the molecular weight of the polyolefin-based resin used in the first polyolefin-based resin layer from the viewpoint of strength. For example, the weight average molecular weight Mw is $5 \times 10^5$ to $12 \times 10^5$, preferably $5.5 \times 10^5$ to $10 \times 10^5$, more preferably $7 \times 10^5$ to $9.5 \times 10^5$, and still more preferably $8 \times 10^5$ to $9 \times 10^5$. From the viewpoint of strength, the weight average molecular weight of the polyolefin-based resin used in the second polyolefin-based resin layer is 1.5 to 4 times, and preferably 2 to 4 times the weight average molecular weight of the polyolefin-based resin used in the first polyolefin-based resin layer.

The molecular weight distribution (Mw/Mn) of the polyolefin-based resin contained in the second polyolefin-based resin layer is not particularly limited, and is, for example, 20 to 180. The molecular weight distribution (Mw/Mn) of the polyolefin-based resin contained in the second polyolefin-based resin layer is particularly preferably 20 or more when the weight average molecular weight of the polyolefin-based resin contained in the second polyolefin-based resin layer is 1.5 to 4 times, preferably 1.8 to 3 times, and more preferably 2 to 2.5 times the weight average molecular weight of the polyolefin-based resin contained in the first polyolefin-based resin. That is, the molecular weight distribution (Mw/Mn) of the polyolefin-based resin contained in the second polyolefin-based resin layer is preferably 20 or more from the viewpoint of sufficiently securing the low molecular weight components at the layer interface with the first polyolefin-based resin layer (that is, sufficiently securing the overlapping portion of the molecular weight distribution between both the layers) to improve the adhesion, thereby obtaining good strength, and is preferably 180 or less from the viewpoint of obtaining the strength of the second polyolefin-based resin layer itself. From the viewpoint of more favorably obtaining these effects, the molecular weight distribution (Mw/Mn) of the polyolefin-based resin used in the second polyolefin-based resin layer is preferably 22 to 170, more preferably 45 to 160, still more preferably 60 to 155, yet still more preferably 80 to 150, even more preferably 100 to 145, and particularly preferably 120 to 140.

The amount of elution of calcium, measured in accordance with EMI F-57, of the material (polyolefin-based resin composition) of the second polyolefin-based resin layer is 30 $\mu g/m^2$ or more, preferably 50 $\mu g/m^2$ or more, more preferably 70 $\mu g/m^2$ or more, still more preferably 80 $\mu g/m^2$ or more, yet still more preferably 90 $\mu g/m^2$ or more, and particularly preferably 95 $\mu g/m^2$ or more from the viewpoint of securing the strength of the multilayer tube in the use environment of 60° C. The multilayer tube of the present invention has an excellent effect of suppressing the elution of calcium and organic components, whereby the elution of calcium can be effectively suppressed even when the material of the second polyolefin-based resin layer contains a large amount of calcium. From such a viewpoint, a suitable example of the amount of elution of calcium is 80 $\mu g/m^2$ or more, 90 $\mu g/m^2$ or more, or 95 $\mu g/m^2$ or more within the above range. The upper limit of the amount of elution of calcium is not particularly limited, and is 120 $\mu g/m^2$ or less, 110 $\mu g/m^2$ or less, or 100 $\mu g/m^2$ or less from the viewpoint of suppressing the elution of calcium.

The calcium concentration in the material (polyolefin-based resin composition) of the second polyolefin-based resin layer is not particularly limited as long as the amount of elution of calcium described above is satisfied, and is, for example, 20 ppm or more, preferably 100 ppm or more, more preferably 500 ppm or more, still more preferably 800 ppm or more, yet still more preferably 1000 ppm or more, even more preferably 1200 ppm or more, and particularly preferably 1400 ppm or more from the viewpoint of securing the strength of the multilayer tube in the use environment of 60° C. The upper limit of the calcium concentration range is, for example, 2000 ppm or less, preferably 1800 ppm or less, and more preferably 1600 ppm or less from the viewpoint of suppressing insufficient strength due to contained calcium itself serving as a starting point of breakage and the viewpoint of suppressing the elution of calcium and organic components.

An amount of elution of organic components (TOC), measured in accordance with EMI F-57, of a material (polyolefin-based resin composition) of the second polyolefin-based resin layer is, for example, more than 30000 $\mu g/m^2$. The multilayer tube of the present invention has an excellent effect of suppressing the elution of calcium and organic components, whereby the elution of organic components can be effectively suppressed even when the material of the second polyolefin-based resin layer contains a large amount of organic components. From such a viewpoint, a suitable example of the amount of elution of organic components is 31000 $\mu g/m^2$ or more, and preferably 31500 $\mu g/m^2$ or more. The upper limit of the amount of elution of organic components is not particularly limited, and is, for example, 35000 $\mu g/m^2$ or less, preferably 34000 $\mu g/m^2$ or less, more preferably 33000 $\mu g/m^2$ or less, and still more preferably 32000 $\mu g/m^2$ or less from the viewpoint of suppressing the elution of the organic components.

The second polyolefin-based resin layer preferably contains an antioxidant. Examples of the antioxidant include phenolic antioxidants, phosphorus-based antioxidants, sulfur-based antioxidants, aromatic amine-based antioxidants, and lactone-based antioxidants. The content of the antioxidant in the second polyolefin-based resin layer is, for example, 0.01% by weight or more, and preferably 0.1% by weight or more, from the viewpoint of suppressing the influence of oxygen to secure preferable strength, and the upper limit of the content of the antioxidant is, for example, 5% by weight or less, preferably 1% by weight or less, and more preferably 0.5% by weight or less.

[4. Gas Barrier Layer]

When the multilayer tube of the present invention has a gas barrier layer, the gas barrier layer is provided outside the second polyolefin-based resin layer. The gas barrier layer prevents oxygen from the outer surface of the multilayer tube from permeating into the second polyolefin-based resin layer and further into the first polyolefin-based resin layer, whereby the strength of the multilayer tube can be increased. It is also preferable to provide the gas barrier layer in that the dissolution of a gas in the transport liquid can also be satisfactorily suppressed.

Examples of the material of the gas barrier layer include polyvinyl alcohol (PVA), an ethylene vinyl alcohol copolymer (EVOH), a polyvinylidene chloride resin (PVDC), and polyacrylonitrile (PAN), and preferable examples thereof include polyvinyl alcohol (PVA) and an ethylene vinyl alcohol copolymer (EVOH).

The thickness of the gas barrier layer is not particularly limited as long as at least gas barrier properties which suppresses the decrease in the strength due to the oxidative deterioration of the polyolefin-based resin can be secured, and is, for example, 50 to 300 µm, preferably 100 to 250 µm, and more preferably 150 to 250 µm.

[5. Application of Multilayer Tube]

The multilayer tube of the present invention suppresses the amount of elution of calcium and organic substances into the transport liquid to a low level and has strength in consideration of the use environment of 60° C., whereby the multilayer tube is particularly useful for transportation of the semiconductor cleaning solution. As the semiconductor cleaning solution, ultrapure water purified to an extremely high purity and from which unnecessary substances are strictly removed, and/or an ultrapure cleaning solution from which unnecessary substances other than necessary components are strictly removed are used. That is, in the present invention, the semiconductor cleaning solution includes ultrapure water and a high purity cleaning solution.

The multilayer tube of the present invention has excellent strength in the use environment of 60° C., whereby the multilayer tube has excellent strength in the use environment of 60° C. when the multilayer tube is used for transportation of an ultrahigh purity cleaning solution, or even when the multilayer tube is used for transportation of an ultrahigh purity cleaning solution obtained by diluting a cleaning stock solution containing at least an amino compound (examples thereof include a cleaning stock solution containing an amino compound such as diaminoalkane, a chelating agent, a surfactant, and a pH adjusting agent) with ultrapure water. The high purity cleaning solution itself is configured to contain various organic components as exemplified above as necessary compositions, but contamination due to unnecessary organic components derived from the piping material other than the necessary components can be suppressed by transportation of the high purity cleaning solution using the multilayer tube of the present invention having excellent TOC elution suppression ability.

The multilayer tube of the present invention can be used as a pipe in a semiconductor cleaning solution manufacturing apparatus, a pipe for transportation of the semiconductor cleaning solution from the semiconductor cleaning solution manufacturing apparatus to use points, and a pipe for returning the semiconductor cleaning solution from the use points, and the like. The semiconductor cleaning pipe of the present invention may be used as a pipe for transportation of the semiconductor cleaning solution after semiconductor cleaning for purification and reuse.

The multilayer tube of the present invention can be used in a wet cleaning process in a manufacturing process of a semiconductor element. The semiconductor element preferably has a higher degree of integration. More specifically, the semiconductor element preferably has a minimum line width of 65 nm or less. Examples of standards for the quality and the like of a semiconductor cleaning solution used in semiconductor manufacture include SEMI F75. The multilayer tube of the present invention can maintain the quality of the semiconductor cleaning solution to be transported at a level satisfying the above standards even when used for transportation of the semiconductor cleaning solution.

The multi layer tubes of the present invention are easily joined to each other, and have excellent workability. Furthermore, both a line used for transportation of ultrapure water and a line used for transportation of an ultrahigh purity cleaning solution can be made of the polyolefin-based resin, whereby both the lines are easily joined to each other, and have excellent workability. When the multilayer tube of the present invention is joined, for example, at relatively low temperatures, fusion working such as butt fusion joining or EF (electric fusion) joining can be easily performed.

[6. Manufacture of Multilayer Tube]

The multilayer tube of the present invention can be manufactured by preparing a material configuring a first polyolefin-based resin layer, a material configuring a second polyolefin-based resin layer, and a material configuring a gas barrier layer as necessary, and the like, and coextrusion-molding the materials so that the thickness of each layer is a predetermined thickness. Since the multilayer tube of the present invention is made of the polyolefin-based resin, it can be manufactured at low cost.

That is, the present invention provides also a method for manufacturing a multilayer tube including the steps of: forming the multilayer tube by co-extruding a polyolefin-based resin composition for an innermost layer and a polyolefin-based resin composition for an outer layer; and cleaning at least an inner surface of the formed multilayer tube. The polyolefin-based resin composition for the innermost layer and the polyolefin-based resin composition for the outer layer are laminated so that the polyolefin-based resin composition for the innermost layer is disposed as the innermost layer, and the polyolefin-based resin composition for the outer layer is disposed outside the innermost layer. An amount of elution of calcium, measured in accordance with SEMI F-57, of the polyolefin-based resin composition for the innermost layer is less than 30 µg/m$^2$. A ratio of a thickness of the innermost layer to a total thickness of the innermost layer (first polyolefin-based resin layer) and the outer layer (second polyolefin-based resin layer) is 0.011 to 0.17.

The polyolefin-based resin composition for the innermost layer is as described as "the material (polyolefin-based resin composition) of the first polyolefin-based resin layer" in the above "2. First Polyolefin-Based Resin Layer". The polyolefin-based resin composition for the outer layer is as described as "the material (polyolefin-based resin composition) of the second polyolefin-based resin layer" in the above "3. Second Polyolefin-Based Resin Layer".

Furthermore, both the polyolefin-based resins contained in the materials of the first polyolefin-based resin layer and the second polyolefin-based resin layer can be synthesized by polymerization due to a chlorine-based catalyst such as a widely used Ziegler-Natta catalyst (catalyst including triethylaluminum and titanium tetrachloride).

The amount of elution of calcium and organic components in each polyolefin-based resin layer can be directly controlled by adjusting the amount of a neutralizing agent to be added after polymerization. The amount of the neutralizing agent is influenced by the amount of the chlorine-based catalyst, whereby the amount of elution of calcium and organic components can be indirectly controlled by adjusting the amount of the chlorine-based catalyst. The molecular weight distribution (Mw/Mn) in each polyolefin-based resin layer can be controlled by adjusting the amount of the chlorine-based catalyst and/or a polymerization process (one-stage polymerization or multi-stage polymerization such as two-stage or more polymerization). For example, when the amount of the chlorine-based catalyst is increased, the molecular weight distribution (Mw/Mn) tends to increase. The multi-stage polymerization such as two-stage or more polymerization can increase in the molecular weight distribution (Mw/Mn).

More specifically, the polyolefin-based resin used for the material of the first polyolefin-based resin layer can be prepared, for example, by polymerization (for example, one-stage polymerization) using a chlorine-based catalyst in an amount appropriately determined by those skilled in the art, and then adding a neutralizing agent (for example, calcium stearate or hydrocalcite or the like) in a predetermined amount (for example, 10 ppm or less in terms of calcium concentration). Alternatively, the neutralizing agent may not be added. The polyolefin-based resin used for the first polyolefin-based resin layer may be polymerized using a polymerization catalyst other than the chlorine-based catalyst, for example, a chromium-based catalyst or a metallocene catalyst. In this case, it is not necessary to add the neutralizing agent.

The polyolefin-based resin used for the material of the second polyolefin-based resin layer can be prepared by polymerization (multi-stage polymerization, preferably two-stage polymerization) using a chlorine-based catalyst in an amount appropriately determined by those skilled in the art, and then adding a neutralizing agent (for example, calcium stearate or hydrocalcite or the like) in a predetermined amount (for example, 20 to 2000 ppm in terms of calcium concentration), and preferably an antioxidant together.

EXAMPLES

Hereinafter, the present invention will be described in more detail with reference to Examples, but the present invention is not limited to these Examples.

(1) Preparation of Multilayer Tube

As a polyolefin (HDPE1) for a first polyolefin-based resin layer (first PO layer), complete additive-free high density polyethylene containing no antioxidant was used. A calcium concentration in the polyolefin for the first PO layer was 5.5 ppm. Molecular weight distribution (ratio [Mw/Mn] determined from a weight average molecular weight [Mw] and a number average molecular weight [Mn] in terms of polystyrene by gel permeation chromatograph measurement; the same applies hereinafter) was 22.2 and Mw was $4.1 \times 10^5$. The proportion of a component having a molecular weight of 1000 or less was 0.75% in an integrated molecular weight distribution curve using standard polystyrene measured by gel permeation chromatography. Furthermore, an amount of elution of calcium and an amount of elution of organic components of the material of the first polyolefin-based resin layer (first PO layer) are as shown in Reference Example 1.

As a polyolefin (HDPE2) for a second polyolefin-based resin layer (second PO layer), PE100 grade high density polyethylene containing an antioxidant was used. A calcium concentration of the polyolefin for the second PO layer was 1500 ppm. Molecular weight distribution (Mw/Mn) was 132.5, and Mw was $8.4 \times 10^5$. Furthermore, an amount of elution of calcium and an amount of elution of organic components of the material of the second polyolefin-based resin layer (second PO layer) are as shown in Reference Example 2.

Resin compositions were extruded so as to have thicknesses shown in Table 1 and Table 2, and the entire surface including the inner surface of the molded tube was cleaned with water. In Comparative Examples 1 and 2, the resin compositions were extruded as single layer tube, and in Examples 1 to 5, the resin compositions were co-extruded as multilayer tubes.

(2) Evaluation of Performance (2-1) Measurement of Amount of Elution of Calcium and Amount of Elution of Organic Components (TOC)

A test sample was obtained by cutting the obtained multilayer tube to a length of 200 mm, enclosing ultrapure water therein, and plugging both the ends with polytetrafluoroethylene (PTFE), followed by wire fixing from the outside. Ultrapure water was used, which had a calcium concentration and a TOC amount equal to or less than the detection limits of measuring devices (an ISP-MS apparatus and a TOC meter described later). The test sample was allowed to stand at 85° C.±5° C. for 7 days for elution. After the elution, the amounts of calcium and TOC in water in the test sample were respectively measured using an ISP-MS device (model number: Agirent 7500cs manufactured by Agilent Technologies) and a TOC meter (model number: ICS2000 manufactured by Thermo Fisher Scientific K.K.). A reference value to be satisfied for the amount of elution of calcium was 30 μg/m$^2$ or less based on the SEMI F57 standard, and a reference value to be satisfied for the amount of elution of TOC was 30,000 μg/m$^2$ or less. The results are shown in Tables 1 and 2.

(3-2) Measurement of Strength (Internal Pressure Creep Performance)

A multilayer tube having an outer diameter of 60 mm was prepared, and cut to a length of 300 mm. Both ends thereof were sealed with a metallic fixing jig to obtain a test sample. According to the internal pressure creep test method described in JIS K6761, the test piece was subjected to conditions of 165 hours, 60° C., and 1 MPa to examine whether or not the test piece was broken. When the sample was broken, the sample was evaluated as poor, and when the sample was not broken, the sample was evaluated as good. The results are shown in Tables 1 and 2.

TABLE 1

|  |  | Example 1 | Example 2 | Example 3 | Example 4 | Example 5 |
|---|---|---|---|---|---|---|
| First PO layer (inner layer) | PO resin | HDPE1 | HDPE1 | HDPE1 | HDPE1 | HDPE1 |
|  | Thickness t1 (mm) | 0.9 | 0.1 | 0.9 | 0.3 | 0.1 |
|  | Thickness ratio t1/(t1 + t2) | 0.155 | 0.017 | 0.040 | 0.013 | 0.043 |
| Second PO layer (outer layer) | PO resin | HDPE2 | HDPE2 | HDPE2 | HDPE2 | HDPE2 |
|  | Thickness t2 (mm) | 4.9 | 5.7 | 21.8 | 22.4 | 2.2 |
|  | Nominal diameter | 50A | 50A | 200A | 200A | 20A |
| Performance of multilayer pipe | Amount of elution of calcium (μg/m$^2$) | 7 | 27 | 14 | 20 | 13 |
|  | Amount of elution of TOC (μg/m$^2$) | 7000 | 29000 | 7000 | 25000 | 29000 |
|  | Internal pressure creep performance | Good | Good | Good | Good | Good |

TABLE 2

|  |  | Comparative Example 1 | Comparative Example 2 | Reference Example 1 | Reference Example 2 |
|---|---|---|---|---|---|
| First PO layer (inner layer) | PO resin | HDPE1 | HDPE1 | HDPE1 | — |
|  | Thickness t1 (mm) | 1 | 0.05 | 5.8 | — |
|  | Thickness ratio t1/(t1 + t2) | 0.172 | 0.009 | — | — |
| Second PO layer (outer layer) | PO resin | HDPE2 | HDPE2 | — | HDPE2 |
|  | Thickness t2 (mm) | 4.8 | 5.75 | — | 5.8 |
|  | Nominal diameter | 20A | 20A | 200A | 200A |

TABLE 2-continued

| | | Comparative Example 1 | Comparative Example 2 | Reference Example 1 | Reference Example 2 |
|---|---|---|---|---|---|
| Performance of multilayer pipe | Amount of elution of calcium ($\mu g/m^2$) | 9 | 60 | 28 | 97 |
| | Amount of elution of TOC ($\mu g/m^2$) | 840 | 32000 | 350 | 32000 |
| | Internal pressure creep performance | Poor | Good | Poor | Good |

As shown in the above Tables, in a pipe made of a material in which the amount of elution of calcium was less than 30 $\mu g/m^2$ (Reference Example 1), the amount of elution of calcium and the amount of elution of TOC in ultrapure water were small, but strength in the environment of 60° C. was not obtained. In a pipe made of a material in which the amount of elution of calcium was 30 $\mu g/m^2$ or more (Reference Example 2), strength in the environment of 60° C. was obtained, but the amount of elution of calcium in ultrapure water was excessive, whereby the required quality of a semiconductor cleaning solution could not be satisfied, and the amount of elution of TOC also did not satisfy the criteria of the present test. In a multilayer tube including an inner layer made of a material in which the amount of elution of calcium was less than 30 $\mu g/m^2$ and an outer layer made of a material in which the amount of elution of calcium was 30 $\mu g/m^2$ or more, when the thickness ratio of the inner layer was more than 0.17 (Comparative Example 1), a remarkable decrease in the amount of elution of calcium was observed, but in the internal pressure creep measurement, breakage occurred in 133 hours, and strength in the environment of 60° C. was not obtained. When the thickness ratio of the inner layer was less than 0.011 (Comparative Example 2), strength in the environment of 60° C. was obtained, but calcium was excessively eluted into ultrapure water, whereby the required quality of the semiconductor cleaning solution could not be satisfied, and the amount of elution of TOC also did not satisfy the criteria of this test.

In contrast, when the thickness ratio of the inner layer was 0.011 to 0.17 (Examples 1 to 5), not only the amount of elution of calcium was suppressed to such an extent as to satisfy the required quality of the semiconductor cleaning solution, but also strength in the environment of 60° C. was obtained.

As described above, although the same resin composition is used in Examples 1 to 5, Comparative Examples 1 and 2, and Reference Example 1, the reason why the amount of elution of calcium decreases in Examples is not clear, but the following mechanism is assumed.

An additive such as a calcium compound contained in the material for the inner layer has a property of being precipitated by being exposed to a high temperature. In the material for the inner layer in a molten state in an extruder, particularly, the amount of the calcium compound due to the precipitation of the additive is higher than that of other portion in a portion in contact with the inner wall of the extruder having a high temperature. When the material for the inner layer in a state where such a calcium compound is unevenly distributed is extruded in a high-temperature mold, a portion having a large amount of the calcium compound in contact with the inner wall of the extruder is exposed on the inner surface of the multilayer tube. In this case, as in Example 1 to 5 and Comparative Example 1, when the thickness of the inner layer to be extruded is small, the thickness of the portion where the amount of the calcium compound is large is also small, and the calcium compound is densely concentrated in a narrower region, whereby the amount of the calcium compound exposed on the inner surface of the multilayer tube increases. When the inner surface of the multilayer tube thus obtained is cleaned, the exposed calcium compound is washed away, whereby the calcium compound is hardly present on the inner surface and a portion close to the inner surface (a very shallow portion from the inner surface) after cleaning. As a result, the amount of elution of calcium is considered to be reduced in Examples 1 to 5 and Comparative Example 1

On the other hand, when the thickness of the inner layer to be extruded is large as in Reference Example 1, the thickness of a portion having a large amount of the calcium compound is also large. In this portion, the calcium compound is present so as to be sparser than that in the case of Examples 1 to 5 and Comparative Example 1, whereby the amount of the calcium compound exposed on the inner surface of the multilayer tube is smaller than that in the case of Examples 1 to 5. When the inner surface of the multilayer tube thus obtained is cleaned, the exposed calcium compound is washed away, but the amount of the calcium compound washed away is less than that in Examples 1 to 5, and the calcium compound still remains on a portion close to the inner surface (a very shallow portion from the inner surface) after cleaning. Since such a remaining calcium compound is eluted, the amount of elution of calcium is considered to increase in Reference Example 1.

Furthermore, when the thickness of the inner layer to be extruded is too small as in Comparative Example 2, a thickness which can unevenly distribute a portion having a large amount of calcium compound as in Examples 1 to 5 and Comparative Example 1 and a portion not having a large amount of calcium compound cannot be secured, whereby even if the inner surface of the obtained multilayer tube is cleaned, no portion where the calcium compound is hardly present is considered to occur. Alternatively, even if it is assumed that the portion having a large amount of calcium compound as in Examples 1 to 5 and Comparative Example 1 and the portion not having a large amount of calcium compound can be unevenly distributed even in Comparative Example 2, the thickness of the portion where almost no calcium compound is present, obtained as a result of cleaning the inner surface of the obtained multilayer tube is too small, and the calcium compound present on the portion close to the inner surface (very shallow portion from the inner surface) is gradually eluted, whereby the amount of elution of calcium is considered to increase. As still another consideration, it is considered that only when the thickness of the inner layer is too small as in Comparative Example 2, calcium present in the outer layer permeates beyond the layer and is eluted from the inner surface.

In Examples 1 to 5, in addition to a decrease in the amount of elution of calcium and an improvement in strength, a decrease in the amount of elution of TOC was also observed. In view of the levels of amounts of elution of calcium and TOC, the multilayer tubes of Examples 1 to 5 were found to be suitable for transportation of a semiconductor cleaning solution suitable for a wet treatment step for a semiconductor element having a minimum line width of 65 nm or less.

DESCRIPTION OF REFERENCE SIGNS 100, 100a, 100b: Multilayer tube
210, 210a: First polyolefin-based resin layer
220: Second polyolefin-based resin layer
300: Gas barrier layer
t1: Thickness of first polyolefin-based resin layer
t2: Thickness of second polyolefin-based resin layer

The invention claimed is:

1. A multilayer tube comprising:
a first polyolefin-based resin layer configuring an innermost layer; and
a second polyolefin-based resin layer disposed outside the first polyolefin-based resin layer,
wherein an amount of elution of calcium, measured in accordance with SEMI F-57, of a material of the first polyolefin-based resin layer is less than 30 µg/m$^2$; and
a ratio of a thickness of the first polyolefin-based resin layer to a total thickness of the first polyolefin-based resin layer and the second polyolefin-based resin layer is 0.011 to 0.17.

2. The multilayer tube according to claim 1, wherein the multilayer tube is used for transportation of a semiconductor cleaning solution.

3. The multilayer tube according to claim 1, wherein the first polyolefin-based resin layer has a thickness of 0.07 mm or more.

4. The multilayer tube according to claim 1, wherein the first polyolefin-based resin layer has a thickness of 0.94 mm or less.

5. The multilayer tube according to claim 1, wherein an amount of elution of calcium, measured in accordance with SEMI F-57, of a material of the second polyolefin-based resin layer is 30 µg/m$^2$ or more.

6. The multilayer tube according to claim 1, wherein a proportion of a component having a molecular weight of 1000 or less in an integral molecular weight distribution curve measured by gel permeation chromatography, of a polyolefin-based resin in the first polyolefin-based resin layer is 0.15% or more.

7. The multilayer tube according to claim 1, further comprising a gas barrier layer disposed outside the second polyolefin-based resin layer.

8. The multilayer tube according to claim 1, wherein the semiconductor cleaning solution is used in a wet treatment step for a semiconductor element having a minimum line width of 65 nm or less.

9. A method for manufacturing a multilayer tube comprising the steps of:
forming the multilayer tube by co-extruding a polyolefin-based resin composition for an innermost layer and a polyolefin-based resin composition for an outer layer; and
cleaning at least an inner surface of the formed multilayer tube,
wherein the polyolefin-based resin composition for the innermost layer and the polyolefin-based resin composition for the outer layer are laminated so that the polyolefin-based resin composition for the innermost layer is disposed as the innermost layer, and the polyolefin-based resin composition for the outer layer is disposed outside the innermost layer,
an amount of elution of calcium, measured in accordance with SEMI F-57, of the polyolefin-based resin composition for the innermost layer is less than 30 µg/m$^2$, and
a ratio of a thickness of the innermost layer to a total thickness of the innermost layer and the outer layer is 0.011 to 0.17.

\* \* \* \* \*